United States Patent
Shauck (10) Patent No.: US 10,083,148 B2
(45) Date of Patent: Sep. 25, 2018

(54) RECIPROCAL QUANTUM LOGIC (RQL) SERIAL DATA RECEIVER SYSTEM

(71) Applicant: Steven Brian Shauck, Crofton, MD (US)

(72) Inventor: Steven Brian Shauck, Crofton, MD (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 98 days.

(21) Appl. No.: 15/217,003

(22) Filed: Jul. 22, 2016

(65) Prior Publication Data
US 2018/0024961 A1    Jan. 25, 2018

(51) Int. Cl.
*G06K 9/38* (2006.01)
*G06F 13/42* (2006.01)
*G01R 19/25* (2006.01)
*H03K 3/38* (2006.01)
*H03K 19/003* (2006.01)
*H03K 19/195* (2006.01)
*G01R 27/02* (2006.01)

(52) U.S. Cl.
CPC ..... *G06F 13/4286* (2013.01); *G01R 19/2509* (2013.01); *G06K 9/38* (2013.01); *H03K 3/38* (2013.01); *H03K 19/00323* (2013.01); *H03K 19/195* (2013.01); *G01R 27/02* (2013.01)

(58) Field of Classification Search
CPC ...... G06K 9/38; G01R 19/2509; G01R 27/02; G06F 13/4286
See application file for complete search history.

(56) References Cited

U.S. PATENT DOCUMENTS

| | | |
|---|---|---|
| 6,420,895 B1 | 7/2002 | Herr et al. |
| 7,532,645 B1 | 5/2009 | Bataineh et al. |
| 2003/0028338 A1 | 2/2003 | Hidaka |

OTHER PUBLICATIONS

International Search Report & Written Opinion dated Oct. 20, 2017 for corresponding PCT/US2017/039265.

*Primary Examiner* — Ernest Unelus
(74) *Attorney, Agent, or Firm* — Tarolli, Sundheim, Covell & Tummino LLP (57) ABSTRACT

One embodiment describes a reciprocal quantum logic (RQL) receiver system. The RQL system is configured to convert a serial input data stream provided from a serial data transmitter into an RQL data stream. The RQL receiver system includes a sampling controller configured to oversample the serial input data stream via a plurality of samples over each sampling window of an RQL clock signal to determine a transition sample corresponding to a transition in a digital value of the serial input data stream in a given one sampling window of the RQL clock signal. The RQL receiver system can be further configured to capture the digital value of the serial input data stream via a capture sample that is a predetermined number of samples subsequent to the transition sample in each sampling window of the RQL clock signal.

20 Claims, 3 Drawing Sheets

RECIPROCAL QUANTUM LOGIC (RQL) SERIAL DATA RECEIVER SYSTEM

TECHNICAL FIELD

The present disclosure relates generally to quantum and classical digital superconducting circuits, and specifically to an RQL serial data receiver system.

BACKGROUND

Superconducting digital technology has provided computing and/or communications resources that benefit from unprecedented high speed, low power dissipation, and low operating temperature. Superconducting digital technology has been developed as an alternative to CMOS technology, and typically comprises superconductor based single flux quantum superconducting circuitry, utilizing superconducting Josephson junctions, and can exhibit typical power dissipation of less than 1 nW (nanowatt) per active device at a typical data rate of 20 Gb/s (gigabits/second) or greater, and can operate at temperatures of around 4 Kelvin.

Data transfer between circuits in a complementary metal-oxide semiconductor (CMOS) environment is frequently implemented via high-speed serial data transfer. In such high-speed serial data transfer, the clock and data can often be embedded on a single line via an encoding scheme. Therefore, the data can be sampled, such as via a phase-locked loop (PLL) that allows the clock signal to be recovered from the single line. However, PLLs do not exist in superconducting technology, such as reciprocal quantum logic (RQL), and the CMOS data transfer techniques are unsuitable from a power standpoint to operate in the cold environment of superconducting implementations.

SUMMARY

One example describes a reciprocal quantum logic (RQL) receiver system. The RQL system is configured to convert a serial input data stream provided from a serial data transmitter into an RQL data stream. The RQL receiver system includes a sampling controller configured to oversample the serial input data stream via a plurality of samples over each sampling window of an RQL clock signal to determine a transition sample corresponding to a transition in a digital value of the serial input data stream in a given one sampling window of the RQL clock signal. The RQL receiver system can be further configured to capture the digital value of the serial input data stream via a capture sample that is a predetermined number of samples subsequent to the transition sample in each sampling window of the RQL clock signal.

Another example includes a method for capturing data from a serial input data stream. The method includes receiving the serial input data stream at an input of a RQL receiver system from a serial data transmitter at a first frequency. The method also includes sampling the serial input data stream via an RQL clock signal having a second frequency that is twice the first frequency to generate a plurality of samples. The method also includes detecting a transition of a digital value of the serial input data stream at a transition sample of the plurality of samples in a given sampling window of the RQL clock signal. The method further includes capturing the digital value of the serial input data stream via a capture sample of the plurality of samples in each sampling window of the RQL clock signal. The capture sample can be a predetermined number of samples subsequent to the transition sample in each sampling window of the RQL clock signal.

Another example describes an RQL receiver system configured to convert a serial input data stream provided from a serial data transmitter into an RQL data stream. The RQL receiver system includes a sampling controller. The sampling controller includes a sampling buffer configured to store a plurality of samples of the serial input data stream obtained over each sampling window of an RQL clock signal. The sampling controller also includes an edge detector configured to determine a transition sample of the plurality of samples stored in the sampling buffer corresponding to a transition in a digital value of the serial input data stream in a given one sampling window of the RQL clock signal. The sampling controller also includes a data capture component configured to capture the digital value of the serial input data stream via a capture sample of the plurality of samples that is a predetermined number of samples subsequent to the transition sample of the plurality of samples stored in the sampling buffer. The sampling controller further includes an integrator system configured to monitor a location of the transition sample in each sampling window of the RQL clock signal in which the transition of the digital value of the serial input data stream occurs, and to change a location of the capture sample in each sampling window of the RQL clock signal via the data capture component in response to a change in the location of the transition sample relative to the plurality of samples stored in the data buffer.

DETAILED DESCRIPTION

The present disclosure relates generally to quantum and classical digital superconducting circuits, and specifically to a reciprocal quantum logic (RQL) serial data receiver system. The RQL serial data receiver can be configured to receive a serial input data stream, such as from a serial data transmitter (e.g., via a CMOS circuit). The RQL serial data receiver system includes a sampling controller that is configured to oversample the serial input data stream via an RQL clock signal, such as configured as a quadrature clock signal that includes an in-phase component and a quadrature-phase component. Therefore, the RQL serial data receiver system can sample the serial input data stream at each peak (e.g., positive peak) and each trough (e.g., negative peak) of two periods of the RQL clock signal to provide a set of eight samples in each sampling window of the RQL clock signal corresponding to a single bit of the serial input data stream. The sampling controller can include a sample buffer to store the samples of the serial input data stream.

The sampling controller can also include an edge detector configured to analyze the samples stored in the sample buffer for each sampling window of the RQL clock signal to detect a transition of a digital value of the serial input data stream for a given RQL clock signal. In response to detecting a transition of the digital value occurring at a transition sample, the sampling controller can be configured to determine a capture sample that is a predetermined number of samples (e.g., half the total number of samples for a given sampling window of the RQL clock signal) subsequent to the transition sample to capture the digital value of the serial input data stream. Therefore, the sampling controller can capture the digital value at a substantially stable portion of the serial input data stream (e.g., between potential digital value transitions). In addition, the sampling controller can also include an integrator system configured to determine clock drift of the RQL clock signal relative to a clock associated with the serial data transmitter and to filter noise and jitter associated with changes in the transition of the digital value. For example, the integrator system can determine a change in a location of the transition sample relative to the plurality of samples of a sampling window of the RQL clock signal, and can increment/decrement one or more counters based on the change in the location. If the count value increases/decreases to a predetermined threshold, then the integrator system can change the capture sample in each sampling window of the RQL clock signal to reflect a drift in the frequency of the RQL clock signal relative to a frequency of the serial input data stream.

Figure 1:
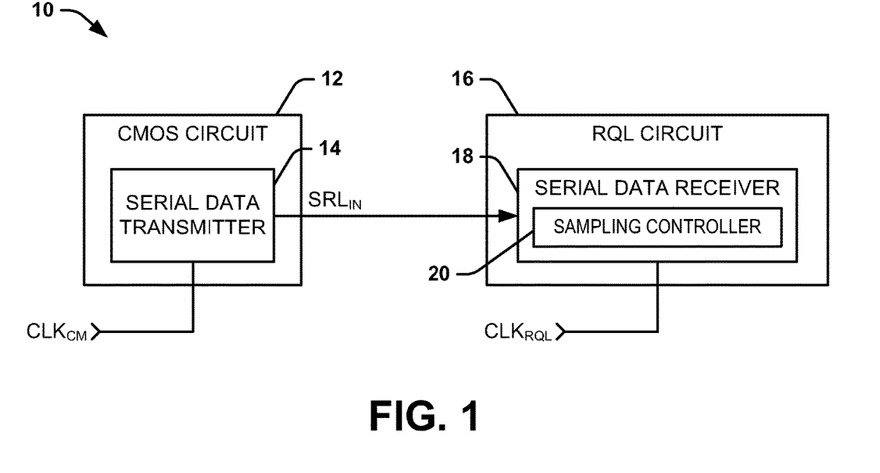
FIG. 1 illustrates an example of a data capture system.

FIG. 1 illustrates an example of a data capture system 10. The data capture system 10 can correspond to a variety of classical digital and superconducting digital circuit applications. In the example of FIG. 1, a complementary metal-oxide semiconductor (CMOS) circuit 12 is demonstrated as providing a serial input data stream $SRL_{IN}$ from a serial data transmitter 14 to a reciprocal quantum logic (RQL) circuit 16. The serial input data stream $SRL_{IN}$ can be a digital signal having a frequency that is based on a clock signal CLKCM, such as generated via a local oscillator (not shown). In the example of FIG. 1, the RQL circuit 16 includes a serial data receiver 18 that is configured to implement data capture of the serial input data stream $SRL_{IN}$ based on an RQL clock signal $CLK_{RQL}$, and thus to capture the serially provided digital values of the serial input data stream $SRL_{IN}$. As an example, the RQL clock signal $CLK_{RQL}$ can have a frequency that is approximately twice a frequency (e.g., data rate) of the clock signal CLKCM. Therefore, the serial data receiver 18 can be configured to capture a single bit of the serial input data stream $SRL_{IN}$ at each sampling window of the RQL clock signal $CLK_{RQL}$ based on the oversampling.

The serial data receiver 18 includes a sampling controller 20 that is configured to oversample the serial input data stream $SRL_{IN}$ based on the RQL clock signal $CLK_{RQL}$ to determine transitions of the digital value of the serial input data stream $SRL_{IN}$ (e.g., from a logic-0 bit to a logic-1 bit or from a logic-1 bit to a logic-0 bit) and to capture the data of the serial input data stream $SRL_{IN}$ based on the transitions of the digital value. As an example, the RQL clock signal $CLK_{RQL}$ can be a quadrature clock signal that includes an in-phase component and a quadrature-phase component that is 90° out-of-phase of the in-phase component. Therefore, the sampling controller 20 can sample the serial input data stream $SRL_{IN}$ at each peak (e.g., positive peak) and each trough (e.g., negative peak) of a two-period sampling window of the RQL clock signal $CLK_{RQL}$ to provide a set of eight samples in each sampling window of the RQL clock signal. Thus, the sampling controller 20 can analyze the eight samples to determine the presence of a transition of a digital value, and in response to determining a transition sample corresponding to a location of the transition of the digital value, can designate a capture sample in each sampling window of the RQL clock signal $CLK_{RQL}$ that corresponds to capture of the digital value (e.g., digital bit) in a substantially repeatable manner.

Figure 2:
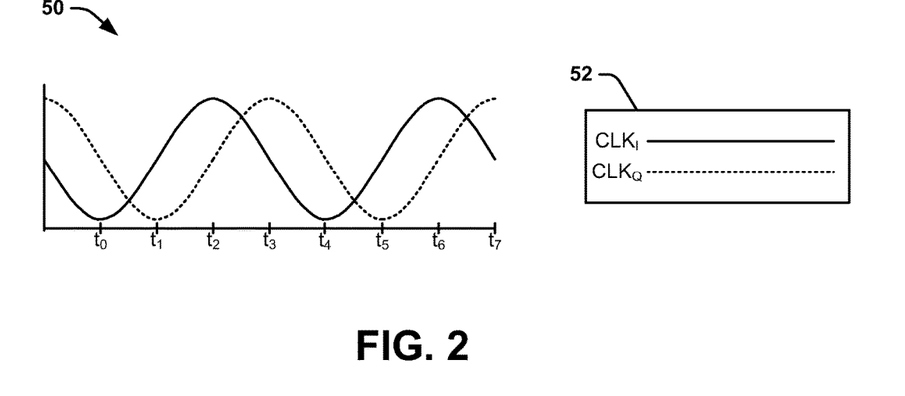
FIG. 2 illustrates an example of a timing diagram.

FIG. 2 illustrates an example of a timing diagram 50. The timing diagram 50 demonstrates the in-phase component $CLK_I$ and the quadrature-phase component $CLK_Q$, as indicated at the legend 52, of the RQL clock signal $CLK_{RQL}$ as a function of time. The in-phase component $CLK_I$ and the quadrature-phase component $CLK_Q$ are each demonstrated as sinusoidal signals having magnitudes centered about zero. The in-phase component $CLK_I$ and the quadrature-phase component $CLK_Q$ in the example of FIG. 2 can collectively correspond to the RQL clock signal $CLK_{RQL}$ that is received by the serial data receiver 18 in the example of FIG. 1. Therefore, reference is to be made to the example of FIG. 1 in the following description of the example of FIG. 2.

The timing diagram 50 demonstrates a single sampling window of the RQL clock signal $CLK_{RQL}$. As described herein, the term "sampling window" with respect to the RQL clock signal $CLK_{RQL}$ describes a duration of the RQL clock signal $CLK_{RQL}$ that corresponds to capturing a single bit of data (e.g., the digital value) of the serial input data stream $SRL_{IN}$. In the example of FIG. 2, the single sampling window of the clock signal $CLK_{RQL}$ includes two periods of each of the in-phase and quadrature-phase components $CLK_I$ and $CLK_Q$. However, it is to be understood that the sampling window is not limited to two periods, but could instead be a single period, more than two periods, or an increment that includes a portion of a single period. Thus, the sampling window of the RQL clock signal $CLK_{RQL}$ defines a plurality of sample times at which the sampling controller 20 samples the serial input data stream $SRL_{IN}$.

At a first time $t_0$, a first negative peak (e.g., trough) of the in-phase component $CLK_I$ occurs, corresponding to a first consecutive sampling time of the serial input data stream $SRL_{IN}$, and thus a time at which a first sample of the serial input data stream $SRL_{IN}$ is captured in the sampling window. At a second time $t_1$, a first negative peak of the quadrature-phase component $CLK_Q$ occurs 90° subsequent to the time $t_0$, corresponding to a second consecutive sampling time of the serial input data stream $SRL_{IN}$. At a third time $t_2$, a first positive peak of the in-phase component $CLK_I$ occurs 90° subsequent to the time $t_1$, corresponding to a third consecutive sampling time of the serial input data stream $SRL_{IN}$. At a fourth time $t_3$, a first positive peak of the quadrature-phase component $CLK_Q$ occurs 90° subsequent to the time $t_2$, corresponding to a fourth consecutive sampling time of the serial input data stream $SRL_{IN}$. Thus, the times $t_0$ through $t_3$ correspond to sampling times through a first period of each of the in-phase and quadrature-phase components $CLK_I$ and $CLK_Q$, and thus a first half of the sampling window of the RQL clock signal $CLK_{RQL}$.

At a fifth time $t_4$, a second negative peak of the in-phase component $CLK_I$ occurs 90° subsequent to the time $t_3$, corresponding to a fifth consecutive sampling time of the serial input data stream $SRL_{IN}$. At a sixth time $t_5$, a second negative peak of the quadrature-phase component $CLK_Q$ occurs 90° subsequent to the time $t_4$, corresponding to a sixth consecutive sampling time of the serial input data stream $SRL_{IN}$. At a seventh time $t_6$, a second positive peak of the in-phase component $CLK_I$ occurs 90° subsequent to the time $t_5$, corresponding to a seventh consecutive sampling time of the serial input data stream $SRL_{IN}$. At an eighth time $t_7$, a second positive peak of the quadrature-phase component $CLK_Q$ occurs 90° subsequent to the time $t_6$, corresponding to an eighth consecutive sampling time of the serial input data stream $SRL_{IN}$. Thus, the times $t_4$ through $t_7$ correspond to sampling times through a second period of each of the in-phase and quadrature-phase components $CLK_I$ and $CLK_Q$, and thus the second half of the sampling window of the RQL clock signal $CLK_{RQL}$. Accordingly, the sampling window that includes the two periods of the –phase and quadrature-phase components $CLK_I$ and $CLK_Q$ defines an 8× oversampling of the serial input data stream $SRL_{IN}$. As described previously, the sampling window is not limited to two periods of the clock signal $CLK_{RQL}$, and thus not limited to 8× oversampling, but could instead provide an oversampling of more or less than 8×, such as depending on a tradeoff between desired sampling speed and/or interference (e.g., inter-symbol interference (ISI)).

Figures 3, 4:
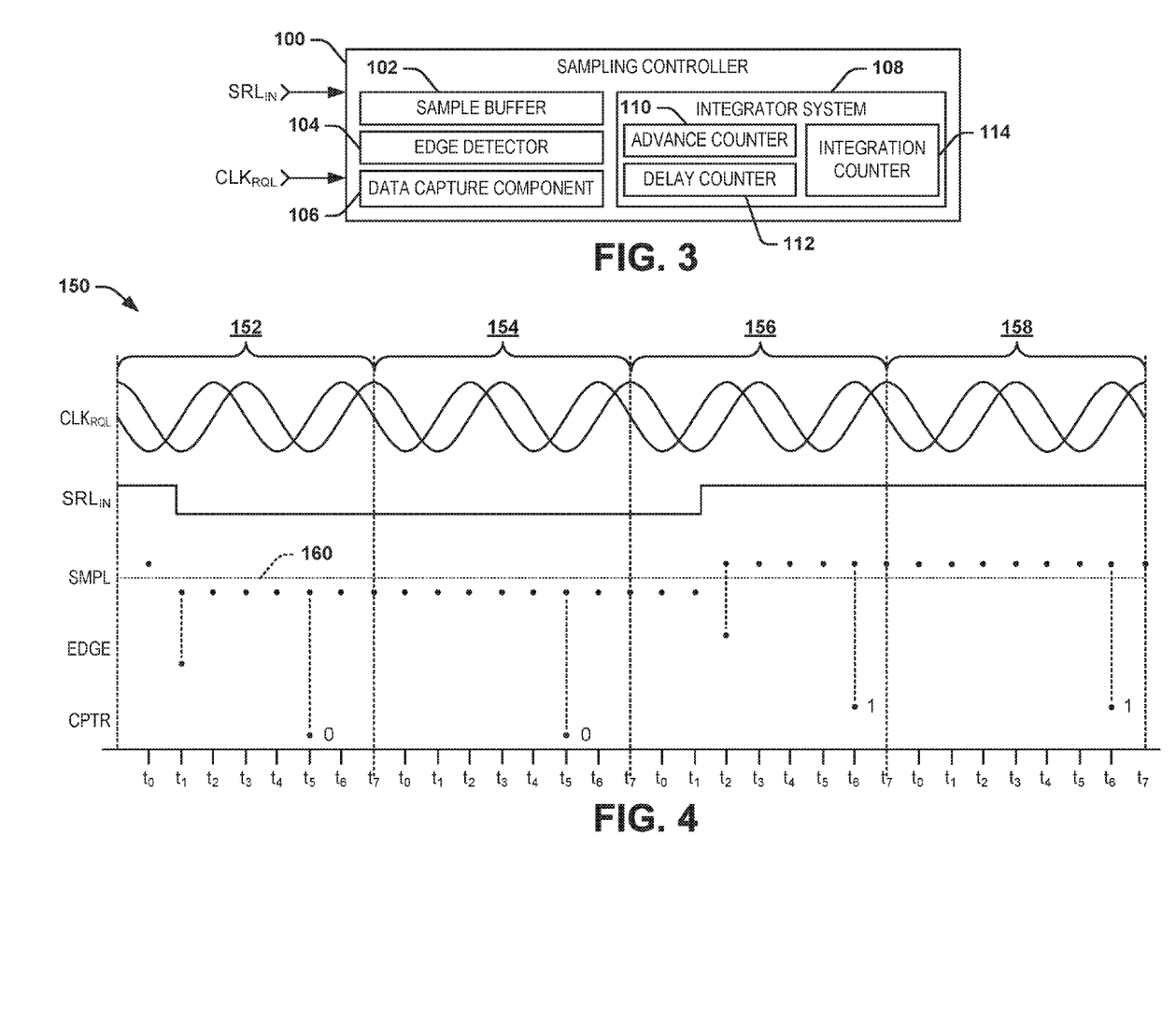
FIG. 3 illustrates an example of a sampling controller in an RQL serial data receiver.
FIG. 4 illustrates another example of a timing diagram.

FIG. 3 illustrates an example of a sampling controller 100 in an RQL serial data receiver. The sampling controller 100 can correspond to the sampling controller 20 in the RQL serial data receiver 18. Thus, the sampling controller 100 can sample the serial input data stream $SRL_{IN}$ based on the RQL clock signal $CLK_{RQL}$, such as including the in-phase component $CLK_I$ and the quadrature-phase component $CLK_Q$ in the example of FIG. 2. Therefore, reference is to be made to the example of FIGS. 1 and 2 in the following description of the example of FIG. 3.

The sampling controller 100 includes a sample buffer 102 that is configured to store a plurality of samples of the serial input data stream $SRL_{IN}$ corresponding to at least one sampling window of the RQL clock signal $CLK_{RQL}$. Thus, the sample buffer 102 can maintain a real-time histogram of a plurality of the samples of the serial input data stream $SRL_{IN}$ that is updated in real-time. The sampling controller 100 also includes an edge detector 104 that is configured to analyze the plurality of samples stored in the sample buffer 102 for a given one sampling window to detect a transition of the digital value of the serial input data stream $SRL_{IN}$ in the given sampling window. As an example, the edge detector 104 can substantially continuously compare an amplitude of the samples in the sequence of the plurality of samples in each of the sampling windows to determine if a difference between the amplitudes is greater than a predetermined threshold, thus indicating a logic-state transition of the serial input data stream $SRL_{IN}$.

Upon determining that a set of samples of a given sampling window includes a transition of the digital value at a transition sample (e.g., a given one of the samples corresponding to the times $t_0$ through $t_7$ in the example of FIG. 2), a data capture component 106 can designate a capture sample as corresponding to a digital value, and thus a digital bit, of the serial input data stream $SRL_{IN}$ that is captured. The capture sample can be a sample that is a predetermined number of samples (e.g., stored as a sample value in the data capture component 106) subsequent in time from the transition sample at which the transition occurred in the respective sampling window or a previous sampling window. The predetermined number of samples that separate the transition sample and the capture sample can nominally correspond to half the number of samples in a given sample window, and thus can correspond to four samples in the example of the sampling window defined in the example of FIG. 2. For example, upon a determination by the edge detector 104 of the second consecutive sample of a given eight-sample sampling window (e.g., at the time $t_1$ of the sampling window defined in the example of FIG. 2) corresponding to the transition sample, the data capture component 106 can define the sixth consecutive sample of the sampling window (e.g., at the time $t_5$ of the sampling window defined in the example of FIG. 2) as the capture sample. Therefore, the capture sample can correspond to the sample for capturing the digital value of the serial input data stream $SRL_{IN}$ for each subsequent sampling window, regardless of whether the serial input data stream $SRL_{IN}$ includes a digital value transition or not, such as until the edge detector 104 determines that a location of the transition bit changes relative to the other samples in the sampling window, either immediately or over a predetermined amount of time, as described in greater detail herein. Thus, the digital bit corresponding to the digital value of the serial input data stream $SRL_{IN}$ at the capture sample can be captured as the data associated with each of the successive sampling windows.

As another example, the data capture component 106 can be configured to define a plurality of capture samples, such as to substantially mitigate high-frequency noise, random errors, and/or duty-cycle issues that may occur in the received serial input data stream $SRL_{IN}$. As an example, the data capture component 106 can define a first capture sample (e.g., four samples ahead of the transition sample), and can define one or more additional capture samples adjacent to the first capture sample to determine if the captured digital value is unanimous or a majority with respect to each of the plurality of capture samples. For example, the data capture component 106 can define the first capture sample, and can define a second and third capture sample corresponding to the two samples adjacent in time to the first capture sample (e.g., three and five samples ahead of the transition sample, respectively). Therefore, as an example, the data capture component 106 can implement a voting algorithm to determine the captured digital value for the sampling window based on the digital values captured at each of the first, second, and third capture samples. Accordingly, the digital value of the serial input data stream $SRL_{IN}$ can be captured in each sampling window in a manner that substantially mitigates high-frequency noise, random errors, and/or duty-cycle issues by evaluating the digital value at each of a plurality of capture samples in each sampling window.

FIG. 4 illustrates another example of a timing diagram 150. The timing diagram 150 demonstrates the RQL clock signal $CLK_{RQL}$ and the serial input data stream $SRL_{IN}$ over time. Particularly, the timing diagram 150 demonstrates a first sampling window 152, a second sampling window 154, a third sampling window 156, and a fourth sampling window 158 of the RQL clock signal $CLK_{RQL}$. The RQL clock signal $CLK_{RQL}$ is demonstrated as including an in-phase component and a quadrature-phase component demonstrated as sinusoidal signals, similar to as demonstrated in the example of FIG. 2. The timing diagram 150 can correspond to operation of the sampling controller 100. Therefore, reference is to be made to the examples of FIGS. 1-3 in the following description of the example of FIG. 4.

The timing diagram 150 demonstrates the sampling of the serial input data stream $SRL_{IN}$ at each peak (e.g., positive peak) and each trough (e.g., negative peak) of the two-period sampling window of the RQL clock signal $CLK_{RQL}$ to provide a set of eight samples in each sampling window of the RQL clock signal. Thus, in each of the sampling windows 152, 154, 156, and 158, the timing diagram 150 demonstrates the sampling times as times $t_0$ through $t_7$, similar to as demonstrated in the example of FIG. 2. In the example of FIG. 4, the samples of the serial input data stream $SRL_{IN}$ are provided as "SMPL", which demonstrates the discrete samples as having digital amplitudes that are above or below a threshold 160. Therefore, the samples SMPL are indicative of a logic-high or logic-low binary state of the serial input data stream $SRL_{IN}$ at a given sample time. The samples SMPL for one or more of the sampling windows 152, 154, 156, and 158 can be stored in the sample buffer 102, as described previously.

As described previously, the edge detector 104 can be configured to analyze the samples SMPL for a given one of the sampling windows 152, 154, 156, and 158 to determine the presence of a transition of a digital value of the serial input data stream $SRL_{IN}$. In the first sampling window 152, the digital value of the serial input data stream $SRL_{IN}$ switches from logic-high to logic-low between the time $t_0$ and $t_1$. In response to analysis of the samples SMPL of the serial input data stream $SRL_{IN}$ in the first sampling window 152 by the edge detector 104, the edge detector 104 can determine that the second consecutive sample at the time $t_1$ corresponds to the location of the transition of the digital value, and thus the transition sample, demonstrated in the example of FIG. 4 as "EDGE". As an example, the edge detector 102 can identify that the amplitude of the first consecutive sample and the second consecutive sample have a difference that is greater than a predetermined threshold and/or have opposite polarity relative to the threshold 160. In response, the data capture component 106 can designate the sixth consecutive sample at the time $t_5$ (e.g., four samples subsequent to the transition sample) to correspond to the capture sample, demonstrated in the example of FIG. 4 as "CPTR". Accordingly, the data capture component 106 captures a logic-0 as the digital value of the serial input data stream $SRL_{IN}$ for the first sampling window 152 based on the digital value of the sixth consecutive sample at the time $t_5$.

In the second sampling window 154, the digital value of the serial input data stream $SRL_{IN}$ remains logic-low throughout the second sampling window 154. In response to analysis of the samples SMPL of the serial input data stream $SRL_{IN}$ in the second sampling window 154 by the edge detector 104, the edge detector 104 determines that there is no transition of the digital value, and thus that there is no transition sample. In response, the data capture component 106 can maintain that the sixth consecutive sample at the time $t_5$ in the second sampling window 154 still corresponds to the capture sample "CPTR". In other words, because the edge detector 102 does not identify a transition in the digital value of the serial input data stream $SRL_{IN}$ during the second sampling window 154, the data capture component 106 maintains the same location of the capture sample as the capture sample of the most recent sampling window. Therefore, because the sixth consecutive sample at the time $t_5$ corresponded to the capture sample in the first sampling window 152, which was the most recent sampling window that included a transition of the digital value of the serial input data stream $SRL_{IN}$, the sixth consecutive sample at the time $t_5$ corresponds to the capture sample in the second sampling window 154. Accordingly, the data capture component 106 captures a logic-0 as the digital value of the serial input data stream $SRL_{IN}$ for the second sampling window 154 based on the digital value of the sixth consecutive sample at the time $t_5$.

In the third sampling window 156, the digital value of the serial input data stream $SRL_{IN}$ switches from logic-low to logic-high between the time $t_1$ and $t_2$. As an example, a frequency drift between the frequency of the RQL clock signal $CLK_{RQL}$ and the serial input data stream $SRL_{IN}$ can result in a change in the location of the transition of the digital value of the serial input data stream $SRL_{IN}$. In response to analysis of the samples SMPL of the serial input data stream $SRL_{IN}$ in the third sampling window 156 by the edge detector 104, the edge detector 104 can determine that the third consecutive sample at the time $t_2$ corresponds to the location of the transition of the digital value, and thus the transition sample. In response, the data capture component 106 can designate the seventh consecutive sample at the time $t_6$ (e.g., four samples subsequent to the transition sample) to correspond to the capture sample. Accordingly, the data capture component 106 captures a logic-1 as the digital value of the serial input data stream $SRL_{IN}$ for the third sampling window 156 based on the digital value of the seventh consecutive sample at the time $t_6$.

In the fourth sampling window 158, the digital value of the serial input data stream $SRL_{IN}$ remains logic-high throughout the fourth sampling window 158. In response to analysis of the samples SMPL of the serial input data stream $SRL_{IN}$ in the fourth sampling window 158 by the edge detector 104, the edge detector 104 determines that there is no transition of the digital value, and thus that there is no transition sample. In response, the data capture component 106 can maintain that the seventh consecutive sample at the time $t_6$ in the fourth sampling window 158 still corresponds to the capture sample "CPTR" because the seventh consecutive sample at the time $t_6$ corresponded to the capture sample in the third sampling window 156, which was the most recent sampling window that included a transition of the digital value of the serial input data stream $SRL_{IN}$. Accordingly, the data capture component 106 captures a logic-0 as the digital value of the serial input data stream $SRL_{IN}$ for the fourth sampling window 158 based on the digital value of the seventh consecutive sample at the time $t_6$.

The example of FIG. 4 thus demonstrates that the location of the capture sample can change based on a change in the location of the transition sample relative to the samples in a given sampling window. However, it is to be understood that the changes in the location of the transition sample could merely correspond to jitter or noise, which could result in spurious changes to the location of the transition sample that are inconsistent. Referring back to the example of FIG. 3, the sampling controller 100 also includes an integrator system 108 that is configured to substantially filter the jitter and/or noise that can result in changes to the location of the transition sample. Therefore, the integrator system 108 can determine whether changes in the location of the transition sample are based on clock drift or based on jitter and/or noise, such that the location of the capture sample can be maintained at an appropriate location that is approximately centered between potential transitions of the digital value of the serial input data stream $SRL_{IN}$ in response to jitter and/or noise.

The integrator system 108 includes an advance counter 110, a delay counter 112, and an integration counter 114. The advance counter 110 and the delay counter 112 can be configured to monitor changes in the location of the transition sample over a series of sampling windows, such that the integrator system 108 can be configured to integrate the changes to the location of the transition sample to determine if the changes to the location of the transition sample are random, such as indicative of noise/jitter, or are a trend, such as indicative of clock drift. As an example, the advance counter 110 and the delay counter 112 are mutually exclusively incremented and decremented in response a change in the location of the transition sample from a previously determined nominal location in each sampling window that includes a transition of the digital value of the serial input data stream $SRL_{IN}$. In response to the count value of either the advance counter 110 or the delay counter 112 exceeding a predetermined threshold value, the integrator system 108 can determine that the change to the location of the transition sample is based on frequency drift of the RQL clock $CLK_{RQL}$ relative to the serial input data stream $SRL_{IN}$. Accordingly, the integrator system 108 can change the nominal location of the transition sample to correspond to the consistent change in the location of the transition sample of the sampling windows relative to the nominal location, and can thus advance or retreat the corresponding location of the capture sample relative to the nominal location (e.g., four samples subsequent to the new nominal location).

For example, the integrator system 108 can set a nominal location of the transition sample as the second consecutive sample at the time $t_1$ in the example of FIGS. 2 and 4. In a subsequent sampling window that includes a digital value transition of the serial input data stream $SRL_{IN}$, the edge detector 104 detects that the transition sample is the third consecutive sample at the time $t_2$. In response, the data capture component 106 can maintain the location of the capture sample at the sixth consecutive sample at the time $t_5$ (e.g., four samples subsequent to the nominal location of the transition sample as the second consecutive sample at the time $t_1$), and the integrator system 108 can increment the value in the advance counter 110 by one (e.g., while also decrementing the value in the delay counter 112 by one). After several subsequent sampling windows that include a digital value transition of the serial input data stream $SRL_{IN}$, the edge detector 104 continues to detect that the transition sample is the third consecutive sample at the time $t_2$. In response, the data capture component 106 maintains the location of the capture sample at the sixth consecutive sample at the time $t_5$ in each subsequent sampling window, and the integrator system 108 increments the value in the advance counter 110 by one in each of the respective sampling windows that include a digital value transition of the serial input data stream $SRL_{IN}$.

In this above example, upon the count value in the advance counter 110 exceeding the predetermined threshold, the integrator system 108 detects that the changes in the location of the transition sample are a result of clock drift, as opposed to noise and/or jitter. Therefore, the integrator system 108 can clear the values from the advance counter 110 and the delay counter 112, can change the nominal location of the transition sample from the second consecutive sample at the time $t_1$ to the third consecutive sample at the time $t_2$, and can correspondingly change the location of the capture sample from the sixth consecutive sample at the time $t_5$ to the seventh consecutive sample at the time $t_6$ (e.g., by storing the change in the data capture component 106). Accordingly, the integrator system 108 can ensure that the location of the capture sample relative to the other samples in the sampling window only changes in response to detected clock drift. It is to be understood that this above example is equally applicable to clock drift that results in the location of the capture sample retreating relative to the other samples in the sampling window, as opposed to advancing relative to the other samples in the sampling window, based on incrementing the delay counter 112 (e.g., while also decrementing the value in the advance counter 110). Furthermore, the integrator system 108 can be configured to redefine the sampling windows based on changes to the locations of the respective transition and capture samples, such as based on redefining the consecutive samples of the sampling window with respect to the periods of the RQL clock signal $CLK_{RQL}$ (e.g., based on which peaks and troughs of the RQL clock signal $CLK_{RQL}$ correspond to which samples of the sampling window). Therefore, the integrator system 108 can maintain the transition and capture samples within the same one sampling window, such as for purposes of storing the samples in the sample buffer 102.

In addition, the integration counter 114 can allow the integrator system 108 to operate as a leaky integrator component that is configured to determine if the changes in the location of the transition sample occur frequently enough to justify a change in the sampling window. For example, the integration counter 114 can be configured to count the number of sampling windows or number of transitions. Therefore, in response to a count value of the integration counter 114 exceeding a predetermined threshold, the integrator system 108 can determine that sufficient time has passed to ignore some previous causes of adjustments to the location of the transition sample. In response, the integrator system 108 can decrement the values in the advance counter 110 and the delay counter 112 to implement the integrator system 108 as a leaky integrator. It is to be understood that the advance counter 110 and the delay counter 112 may be configured to maintain only a positive or zero count value, such that the advance counter 110 and the delay counter 112 may be configured to not decrement the respective count values less than zero, even when the respective operation would nominally call for decrementing the count values.

Figure 5:
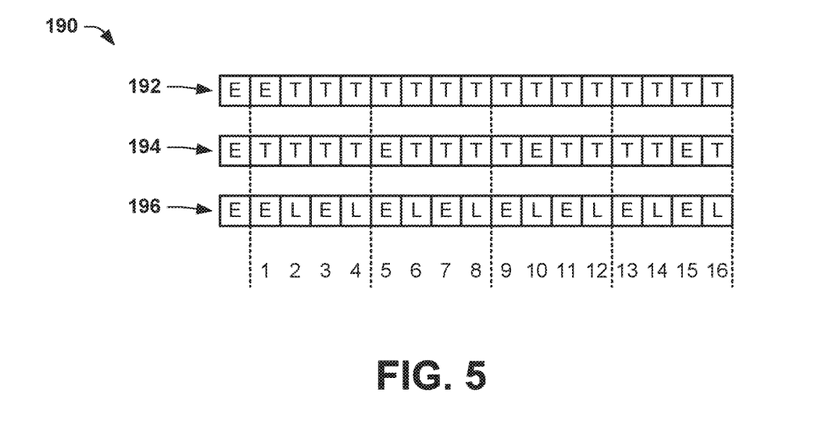
FIG. 5 illustrates yet another example of a timing diagram.

FIG. 5 illustrates yet another example of a timing diagram 190. The timing diagram 190 demonstrates three separate diagrams of sequences of sampling windows of corresponding respective data streams. In the example of FIG. 5, the sequences of sampling windows are demonstrated as a first sequence 192, a second sequence 194, and a third sequence 196, with each of the sequences 192, 194, and 196 including a single sampling window followed by sixteen sequential sampling windows, with each sampling window being labeled one of "E", "T", or "L". The sampling windows "E" correspond to the capture sample being detected early relative to the immediately preceding sampling window, the sampling windows "T" correspond to the capture sample being detected the same as the immediately preceding sampling window, and the sampling windows "L" correspond to the capture sample being detected late relative to the immediately preceding sampling window. In the example of FIG. 5, the sampling windows in the sequences 192, 194, and 196 are demonstrated as being provided in groups of four for clarity.

The first sequence 192 demonstrates a single "E" sampling window followed by a pattern of TTTT TTTT TTTT TTTT sampling windows. Thus, in the example of the first sequence 192, after sixteen (threshold) transitions at the nominal time of the capture sample (corresponding to the "T" sampling windows), the integration counter 114 can ignore one reason (the "E" sampling window) to move the capture sample of the successive sampling windows. However, in the sequence 194 that demonstrates a single "E" followed by TTTT ETTT TETT TTET, the sequence 194 includes sixteen transitions after the first "E" sampling window. Therefore, the integration counter 114 can increment the count value of the advance counter 110 by three, as opposed to four given that it ignores the first "E". If the sequence 194 continues to repeat the demonstrated pattern, the integration counter 114 can transition the capture sample to a different sample time. For example, the "E" sampling window followed by a sequence of twenty one groups of "TTTTE" sampling windows can be determined by the integration counter to provide twenty-two reasons to move the capture sample, but can ignore 5*21/16=6 reasons, for a net of sixteen increments of the advance counter 110, which might be sufficient for moving the threshold. However, the first sequence 192 of the "E" sampling window followed by nineteen "T" sampling windows may not provide sufficient reason to move the capture sample in successive sampling windows.

The sequence 196 demonstrates a single "E" sampling window followed by a pattern of ELEL ELEL ELEL ELEL sampling windows, and is thus equivalent to one "E" followed by sixteen "T" sampling windows for this purpose, given that nine "E" sampling windows minus eight "L" sampling windows provides a net of one "E" sampling window given that every sixteen transitions the integration counter 114 can ignore one sampling window, thus providing an effective zero transition of the capture sample.

As an example, most typical data encoding protocols can have a high minimum transition rate, so an associated data receiver can track them. If a protocol allows thousands, or hundreds, or even ten consecutive samples to be the same value, the receiver may fail to track the drift fast enough. Thus, the "EL" pattern described previously with respect to the third sequence 196 can arise from a duty-cycle issue in the path and can be filtered just like normal transitions. As another example, the integration counter can simply count time instead, and thus the opportunity for a transition of the capture sample rather than the number of transitions of the capture sample. Statistically speaking, any protocol can have a transition occur on at least half the opportunities, and extremes like Manchester encoding can guarantee a minimum of ½, and can statistically provide ¾. Thus, in Manchester encoding, sixteen transitions can occur in, at most, thirty-two sampling windows, and on average, in about twenty-one sampling windows. Thus, ignoring every twenty-one sampling windows can be roughly equivalent to ignoring every sixteen transitions. As a result, implementing the integration counter 114 as a leaky integrator provides that some "forgetfulness" of transitions of the capture sample can provide for an improved data capture system. Furthermore, because of the difficulty of designing medium logic circuits in an RQL environment that fit in a single clock, the integration counter 114 that behaves as a simple circuit that approximates a leaky integrator can be more beneficial than implementing additional circuitry that can be required to implement an exact leaky integrator.

As described herein the use of the advance counter 110 and the delay counter 112 is provided by example, such that the integrator system 108 can implement additional or alternative manners for filtering noise and/or jitter. For example, the integrator system 108 can move the transition sample based on frequency of movement within a given number of sampling windows to substantially mitigate oscillation of the movement of the transition sample, such as resulting in the integrator system 108 advancing the transition sample, delaying the transition sample, then advancing the transition sample, etc. in an oscillatory manner. Such oscillation might hinder the ability of the integrator system 108 to track actual trends, so the movements of the transition sample could only occur when there is a compelling reason to move. Thus, one alternative to the use of the advance counter 110 and the delay counter 112 could be the use of a single signed counter with the leaky integration concept described previously. As a result, a single signed counter along with implementation of the leaky integration described previously can provide that the integration counter 114 can operate as a leaky integrator that tends to ignore reasons to move the capture sample and slowly moves the reason to move the capture sample to a neutral zero value. If the leaky integrator becomes plus threshold or minus threshold, it should move the capture sample and the sampling window. A leaky integrator that is at or near zero can indicate that the sampling window is well aligned, but if there is a frequency mismatch, the leaky integrator can periodically approach one of the thresholds to cause a shift in the window (and reset of the leaky integrator). At that point, the leaky integrator should stay near zero for a predetermined time. For example if the associated transmitter and the data receiver operate at different frequencies of 5 GHz and 5.001 GHz, the data receiver can adjust the sample window at a rate of about 1 MHz (i.e., the difference in the frequencies). In the million clock cycles between advances, the leaky integrator can stay near zero for several hundred thousand clock cycles. Then over a few thousands clocks, the leaky integrator can start to drift to one threshold, and can then, over a few hundred clocks, the leaky integrator can increase the drift more rapidly and thus move the sample point. Accordingly, the integrator system 108 can provide the tracking of the transition sample, and thus the appropriate capture sample, in a variety of ways.

Furthermore, it is to be understood that the integrator system 108 can be programmed to accommodate exceptional cases of a change in the location of the transition sample. As a first example, if the location of the transition sample is expected to change from the $0^{th}$ sample location to the $7^{th}$ sample location in the next consecutive sampling window, then there could be two valid samples in a given eight sample location sampling window. Similarly, if the location of the transition sample is expected to change from the $7^{th}$ sample location to the $0^{th}$ sample location in the next consecutive sampling window, then there could be no valid samples in a given eight sample location sampling window. The integrator system 108 can account for sampling windows that include either two valid samples or zero valid samples, and can continue to provide sampling for consecutive sampling windows thereafter.

Accordingly, the sampling controller 100 is described herein as a manner for providing high-speed data capture of a serial input data stream in an RQL environment. Based on the oversampling of the serial input data stream $SRL_{IN}$, the sampling controller 100 can capture the data at very high data rates (e.g., 10 GHz) in a manner that emulates the function of a phase-locked loop (PLL) and recovered clock that cannot be implemented in an RQL environment. Additionally, the sampling controller 100 can be implemented without the need for expensive test equipment or very low data rates, which allows for a more efficient and cost-effective data capture methodology.

Figure 6:
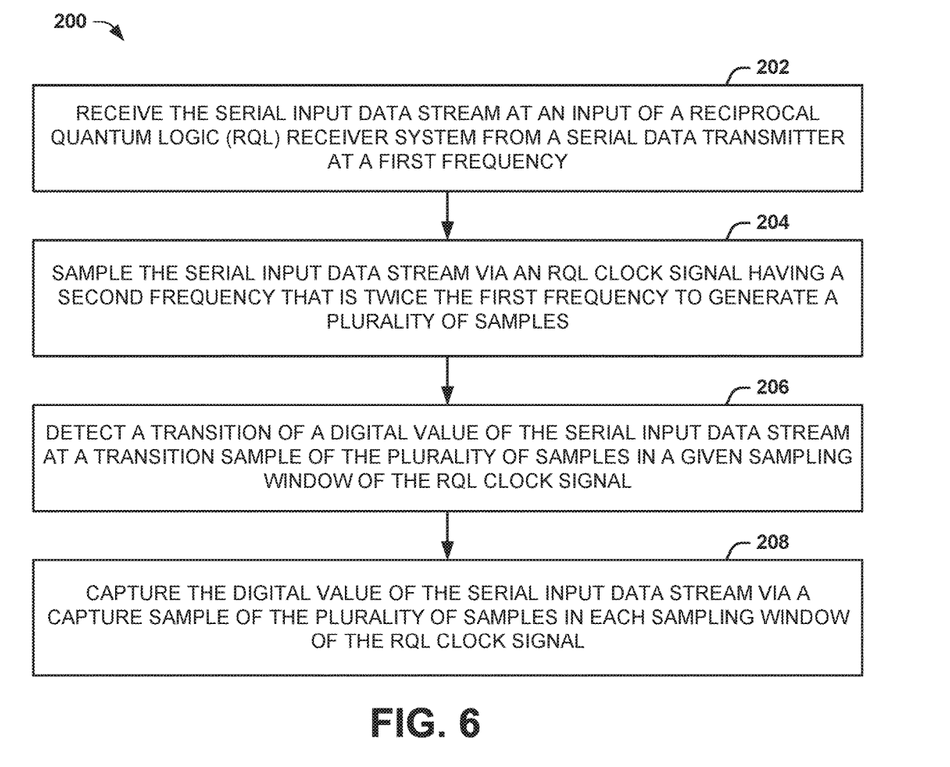
FIG. 6 illustrates an example of a method for generating a DC output current.

In view of the foregoing structural and functional features described above, a methodology in accordance with various aspects of the present invention will be better appreciated with reference to FIG. 6. While, for purposes of simplicity of explanation, the methodology of FIG. 6 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 6 illustrates an example of a method 200 for capturing data from a serial input data stream (e.g., the serial input data stream $SRL_{IN}$). At 202, the serial input data stream is received at an input of an RQL receiver system (e.g., the RQL receiver system 18) from a serial data transmitter (e.g., the serial data transmitter 14) at a first frequency. At 204, the serial input data stream is sampled via an RQL clock signal (e.g., the RQL clock signal $CLK_{RQL}$)

having a second frequency that is twice the first frequency to generate a plurality of samples (e.g., at each peak and each trough of the RQL clock signal). At 206, a transition of a digital value of the serial input data stream is detected at a transition sample of the plurality of samples in a given sampling window (e.g., the sampling windows 152, 154, 156, and 158) of the RQL clock signal. At 208, the digital value of the serial input data stream is captured via a capture sample of the plurality of samples in each sampling window of the RQL clock signal. The capture sample can be a predetermined number of samples subsequent to a location of the transition sample in each sampling window of the RQL clock signal.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A reciprocal quantum logic (RQL) receiver system configured to convert a serial input data stream provided from a serial data transmitter into an RQL data stream, the RQL receiver system comprising:
   a sampling controller configured to oversample the serial input data stream via a plurality of samples over each of a plurality of sampling windows of an RQL clock signal to determine a transition sample corresponding to one of the plurality of samples associated with a transition in a digital value of the serial input data stream in a given one sampling window of the RQL clock signal,
   the RQL receiver system being further configured to capture the digital value of the serial input data stream via a capture sample that is a predetermined number of samples subsequent to a location of the transition sample in each sampling window of the RQL clock signal.

2. The system of claim 1, wherein the RQL clock signal is a quadrature clock signal comprising an in-phase component and a quadrature-phase component and having a frequency that is approximately equal to twice a frequency of the serial input data stream, such that the sampling controller is configured to sample the serial input data stream at each positive and negative peak of the RQL clock signal to provide eight samples of the serial input data stream over each sampling window of the RQL clock signal.

3. The system of claim 1, wherein the sampling controller is configured to capture the digital value of the serial input data stream via the capture sample that is a number of samples equal to half of the plurality of samples corresponding to each sampling window of the RQL clock signal subsequent to the location of the transition sample in each sampling window of the RQL clock signal.

4. The system of claim 3, wherein the capture sample is a first capture sample, wherein the sampling controller is further configured to capture the digital value of the serial input data stream via at least one additional capture sample that corresponds to a respective at least one next or at least one previous sample with respect to the first capture sample, wherein the sampling controller is further configured to determine the digital value of the serial input data stream in a given sampling window based on a voting algorithm corresponding to the digital value of a majority of captured values of the serial input stream at each of the respective first capture sample and the respective at least one additional capture sample.

5. The system of claim 1, wherein the sampling controller is configured to monitor the location of the transition sample corresponding to the location of the transition of the digital value of the serial input data stream in each sampling window of the RQL clock signal in which the transition of the digital value of the serial input data stream occurs, and is configured to change a location of the capture sample in each sampling window of the RQL clock signal in response to a change in the location of the transition sample relative to the plurality of samples.

6. The system of claim 1, wherein the sampling controller comprises an integrator system configured to determine clock drift of the RQL clock signal relative to a clock associated with the serial data transmitter and to filter noise and jitter associated with changes in the transition of the digital value based on changes in the location of the transition sample relative to the plurality of samples.

7. The system of claim 6, wherein the integrator system comprises at least one counter configured to count a net change in the transition sample with respect to the plurality of samples over a predetermined time and is configured to adjust the location of the capture sample forward or backward relative to the plurality of samples of the sampling window of the RQL clock signal in response to a non-zero net change of the transition sample with respect to the plurality of samples throughout a duration of the predetermined time.

8. The system of claim 7, wherein the at least one counter comprises:
   an advance counter configured to increment an advance count value in response to the location of the transition sample drifting forward relative to the plurality of samples in the RQL clock signal; and
   a delay counter configured to increment a delay count value in response to the location of the transition sample drifting backward relative to the plurality of samples in the RQL clock signal, wherein the advance counter is configured to decrement the advance count value in response to the delay counter incrementing the delay count value, and wherein the delay counter is configured to decrement the delay count value in response to the advance counter incrementing the advance count value.

9. The system of claim 1, wherein the sampling controller is configured to monitor changes in the location of the transition sample corresponding to changes in the transition of the digital value of the serial input data stream relative to the plurality of samples in each sampling window of the RQL clock signal at which the transition occurred via a plurality of counters and to filter the noise and jitter associated with changes in the transition of the digital value based on changes in the transition sample with respect to the plurality of samples via an integrator system.

10. A method for capturing data from a serial input data stream, the method comprising:
    receiving the serial input data stream at an input of a reciprocal quantum logic (RQL) receiver system from a serial data transmitter at a first frequency;
    sampling the serial input data stream via an RQL clock signal having a second frequency that is twice the first frequency to generate a plurality of samples;

detecting a transition of a digital value of the serial input data stream at a transition sample of the plurality of samples in a given sampling window of the RQL clock signal; and capturing the digital value of the serial input data stream via a capture sample of the plurality of samples in each sampling window of the RQL clock signal, the capture sample being a predetermined number of samples subsequent to a location of the transition sample in each sampling window of the RQL clock signal.

11. The method of claim 10, wherein sampling the serial input data stream comprises sampling the serial input data stream at each positive and negative peak of each of an in-phase component and a quadrature-phase component of the RQL clock signal.

12. The method of claim 10, wherein capturing the digital value comprises capturing the digital value of the serial input data stream via the capture sample that is half of the plurality of samples of each sampling window of the RQL clock signal subsequent to the transition sample in each sampling window of the RQL clock signal.

13. The method of claim 10, further comprising:
monitoring the location of the transition sample relative to the plurality of samples over a plurality of consecutive sampling windows of the RQL clock signal; and
changing a location of the capture sample relative to the plurality of samples in response to the location of the transition sample having changed from a first location to a second location in each of the plurality of consecutive sampling windows of the RQL clock signal.

14. The method of claim 10, further comprising:
incrementing an advance counter and decrementing a delay counter in response to the location of the transition sample advancing relative to the plurality of samples in each sampling window of the RQL clock signal;
decrementing the advance counter and incrementing the delay counter in response to the location of the transition sample retreating relative to the plurality of samples in each sampling window of the RQL clock signal;
advancing a location of the capture sample in response to a count value of the advance timer exceeding a predetermined advance threshold; and
delaying the location of the capture sample in response to a count value of the delay timer exceeding a predetermined delay threshold.

15. The method of claim 14, further comprising:
incrementing an integration counter at each sampling window of the RQL clock signal based on the advance counter and the delay counter; and
decrementing the count value of the advance counter and the delay counter based on the integration counter to substantially filter noise and jitter associated with changes in the transition of the digital value.

16. A reciprocal quantum logic (RQL) receiver system configured to convert a serial input data stream provided from a serial data transmitter into an RQL data stream, the RQL receiver system comprising a sampling controller, the sampling controller comprising:
a sampling buffer configured to store a plurality of samples of the serial input data stream obtained over each sampling window of an RQL clock signal;
an edge detector configured to determine a transition sample corresponding to one of the plurality of samples stored in the sampling buffer that is associated with a transition in a digital value of the serial input data stream in a given one sampling window of the RQL clock signal;
a data capture component configured to capture the digital value of the serial input data stream via a capture sample of the plurality of samples that is a predetermined number of samples subsequent to the transition sample of the plurality of samples stored in the sampling buffer; and
an integrator system configured to monitor a location of the transition sample in each sampling window of the RQL clock signal in which the transition of the digital value of the serial input data stream occurs, and to change a location of the capture sample in each sampling window of the RQL clock signal via the data capture component in response to a change in the location of the transition sample relative to the plurality of samples stored in the data buffer.

17. The system of claim 16, wherein the RQL clock signal is a quadrature clock signal comprising an in-phase component and a quadrature-phase component and having a frequency that is approximately equal to twice a frequency of the serial input data stream, wherein the sampling controller is configured to sample the serial input data stream at each positive and negative peak of the RQL clock signal to store eight samples of the serial input data stream over each sampling window of the RQL clock signal in the sampling buffer.

18. The system of claim 16, wherein the sampling controller is configured to capture the digital value of the serial input data stream via the capture sample that is a number of samples equal to half of the plurality of samples corresponding to each sampling window of the RQL clock signal subsequent to the transition sample in each sampling window of the RQL clock signal.

19. The system of claim 16, wherein the integrator system comprises at least one counter configured to count a net change in the transition sample with respect to the plurality of samples over a predetermined time and is configured to adjust the capture sample forward or backward relative to the plurality of samples of the sampling window of the RQL clock signal in response to a non-zero net change of the transition sample with respect to the plurality of samples throughout a duration of the predetermined time.

20. The system of claim 19, wherein the at least one counter comprises:
an advance counter configured to count occurrences of the location of the transition sample drifting forward relative to the plurality of samples in the RQL clock signal; and
a delay counter configured to count occurrences of the location of the transition sample drifting backward relative to the plurality of samples in the RQL clock signal, wherein the advance counter and the delay counter are each configured to decrement a count value in response to a count value incrementing in the other of the advance counter and the delay counter.

* * * * *